United States Patent
Hu et al.

(10) Patent No.: US 8,656,263 B2
(45) Date of Patent: Feb. 18, 2014

(54) TRELLIS-CODED MODULATION IN A MULTI-LEVEL CELL FLASH MEMORY DEVICE

(75) Inventors: Xinde Hu, San Diego, CA (US); Anthony D. Weathers, San Diego, CA (US); Richard D. Barndt, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 97 days.

(21) Appl. No.: 13/118,137

(22) Filed: May 27, 2011

(65) Prior Publication Data

US 2012/0240006 A1    Sep. 20, 2012

Related U.S. Application Data

(60) Provisional application No. 61/349,701, filed on May 28, 2010.

(51) Int. Cl.
*H03M 13/00* (2006.01)
(52) U.S. Cl.
USPC ............................ 714/792; 714/758; 714/781
(58) Field of Classification Search
USPC ......... 714/718, 721, 752, 758, 763, 773, 781, 714/782, 784, 792
See application file for complete search history.

(56) References Cited

U.S. PATENT DOCUMENTS

| | | | |
|---|---|---|---|
| 6,279,133 B1* | 8/2001 | Vafai et al. | 714/763 |
| 2007/0171730 A1* | 7/2007 | Ramamoorthy et al. | 365/185.33 |
| 2009/0244973 A1* | 10/2009 | Scheppler et al. | 365/185.09 |
| 2010/0318877 A1* | 12/2010 | Amato et al. | 714/755 |

OTHER PUBLICATIONS

Wymeersch, H.; Steendam, H.; Moeneclaey, M.;, "Interleaved coded modulation for non-binary codes: a factor graph approach," Global Telecommunications Conference, 2004. Globecom '04. IEEE , vol. 1, No., pp. 525-529 vol. 1, Nov. 29, 2004-Dec. 3, 2004.*

* cited by examiner

*Primary Examiner* — Cynthia Britt
(74) *Attorney, Agent, or Firm* — McDermott Will & Emery LLP

(57) ABSTRACT

A method and system for storing data in a multi-level cell (MLC) flash memory device are described. The method includes receiving data for storage in the flash memory device, the flash memory device comprising an array of MLC flash memory cells, and encoding the received data into non-binary symbols according to a trellis-coded modulation scheme. The method further includes writing each of the non-binary symbols to a respective flash memory cell set, wherein each flash memory cell set comprises a plurality of MLC flash memory cells.

24 Claims, 6 Drawing Sheets

TRELLIS-CODED MODULATION IN A MULTI-LEVEL CELL FLASH MEMORY DEVICE

This application claims the benefit of U.S. Provisional Application No. 61/349,701, filed May 28, 2010, which is hereby incorporated by reference herein.

BACKGROUND

The present disclosure concerns flash memory devices and, in particular, error correction mechanisms for multi-level cell flash memory devices.

Flash memory devices, such as solid-state drives, are becoming increasingly popular for both consumer and enterprise applications. While flash memory devices have many performance advantages compared to conventional hard disk drives, the performance of flash memory devices tends to decrease as the total read, write, and erase cycles (I/O cycles) performed in the devices increase. This performance degradation is even more pronounced in multi-level cell (MLC) flash memory compared to single-level cell (SLC) flash memory. More sophisticated error correction algorithms are needed to improve the endurance of flash memory devices and to allow device manufacturers to take advantage of the increased data capacity available using MLC flash memory.

SUMMARY

According to one aspect of the subject technology, a method for storing data in a multi-level cell (MLC) flash memory device is provided. The method includes receiving data for storage in the flash memory device, the flash memory device comprising an array of MLC flash memory cells, and encoding the received data into non-binary symbols according to a trellis-coded modulation scheme. The method further includes writing each of the non-binary symbols to a respective flash memory cell set, wherein each flash memory cell set comprises a plurality of MLC flash memory cells.

According to another aspect of the subject technology, a machine-readable medium containing machine-executable instructions which when executed by a machine perform a method for storing data in a multi-level (MLC) flash memory device. The method includes receiving data for storage in the flash memory device, the flash memory device comprising an array of MLC flash memory cells, and encoding the received data into non-binary symbols according to a trellis-coded modulation scheme. The method further includes writing each of the non-binary symbols to a respective flash memory cell set, wherein each flash memory cell set comprises a plurality of MLC flash memory cells.

According to another aspect of the subject technology, a multi-level cell (MLC) flash memory device is provided. The device includes a controller configured to receive data for storage in the flash memory device, the flash memory device comprising an array of MLC flash memory cells, and an encoder configured to encode the received data into non-binary symbols according to a trellis-coded modulation scheme. The device further includes an array of MLC flash memory cells configured to store each of the non-binary symbols to a respective flash memory cell set in response to a write command received from the controller, wherein each flash memory cell set comprises a plurality of MLC flash memory cells.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
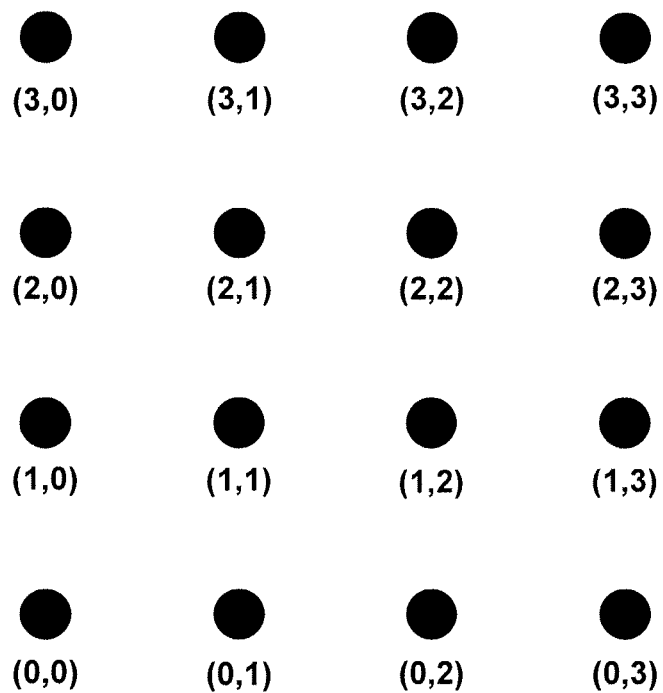
FIG. 1 is a diagram representing a two-dimensional signal constellation according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

MLC flash memory stores multiple bits of data in each flash memory cell using multiple program voltage levels corresponding to the different bit combinations. As used herein, MLC flash memory refers to flash memory cells configured to store two or more bits per cell. For example, two-bit MLC flash memory uses four program voltage levels to represent the four different possible combinations of two bits stored in each flash memory cell. The use of non-binary program voltage levels to represent multiple bits allows trellis-coded modulation schemes to be used to store data in MLC flash memory devices. However, the 1/2 code rate used to encode one data bit and to modulate the resulting two encoded bits into one of the four program voltage levels for storage in a MLC flash memory cell is not efficient since half of the storage capacity is used for coding.

Multi-dimensional trellis-coded modulation schemes allow code rates having greater efficiencies than one-dimensional schemes to be used. For example, a two-dimensional scheme where each dimension has four possible modulation levels allows a 3/4 code rate to be used to encode three bits of data and modulate the resulting four encoded bits into one of sixteen possible constellation points in the scheme. MLC flash memory devices possess characteristics that make them suitable for multi-dimensional trellis-coded modulation schemes. First, MLC flash memory provides a non-binary signal space represented by the different program voltage levels. Second, the read levels of MLC flash memory cells are relatively independent of one another. Accordingly, grouping MLC flash memory cells into cell sets, where each cell in the set represents a different dimension, provides orthogonality between signal dimensions. For example, two-bit MLC flash memory cells may be grouped into flash memory cell sets containing two cells each to facilitate a two-dimensional trellis-coded modulation scheme to be implemented using a 3/4 code rate. Similarly, two-bit MLC flash memory cells may be grouped into flash memory cell sets containing three cells each to facilitate a three-dimensional trellis-coded modulation scheme to be implemented using a 5/6 code rate. Those skilled in the art will recognize that techniques along the lines of these described herein may be used to implement multi-dimensional trellis-coded modulation schemes using cell sets comprising three-bit MLC flash memory cells as well.

Trellis-coded modulation schemes are based on signal constellations representing the different modulation points used to encode data. FIG. 1 is a graphical representation of a two-dimensional signal constellation with each dimension having four possible modulation levels. The signal constellation depicted in FIG. 1 may correspond to a trellis-coded modulation scheme derived for two-bit MLC flash memory cells organized into flash memory cell sets of two. The four modulation levels possible in each MLC flash memory cell are represented by the numbers 0, 1, 2, and 3 shown in FIG. 1, where each point in the constellation is represented by a specific modulation level for each MLC flash memory cell in the set of two.

Trellis-coded modulation relies on a trellis that is comprised of encoder/decoder states and transitions between the encoder/decoder states. The transitions between the states are defined by input data bits and the encoder output resulting from the input data bits. Data sequences are encoded or decoded by using paths defined by the trellis. To maximize the error correction capabilities of a trellis-coded modulation scheme, the distances between possible paths through the trellis should be maximized. According to one aspect of the subject technology, set partitioning is used on the signal constellation to design a trellis that provides maximum separation between possible paths through the trellis.

Figure 2:
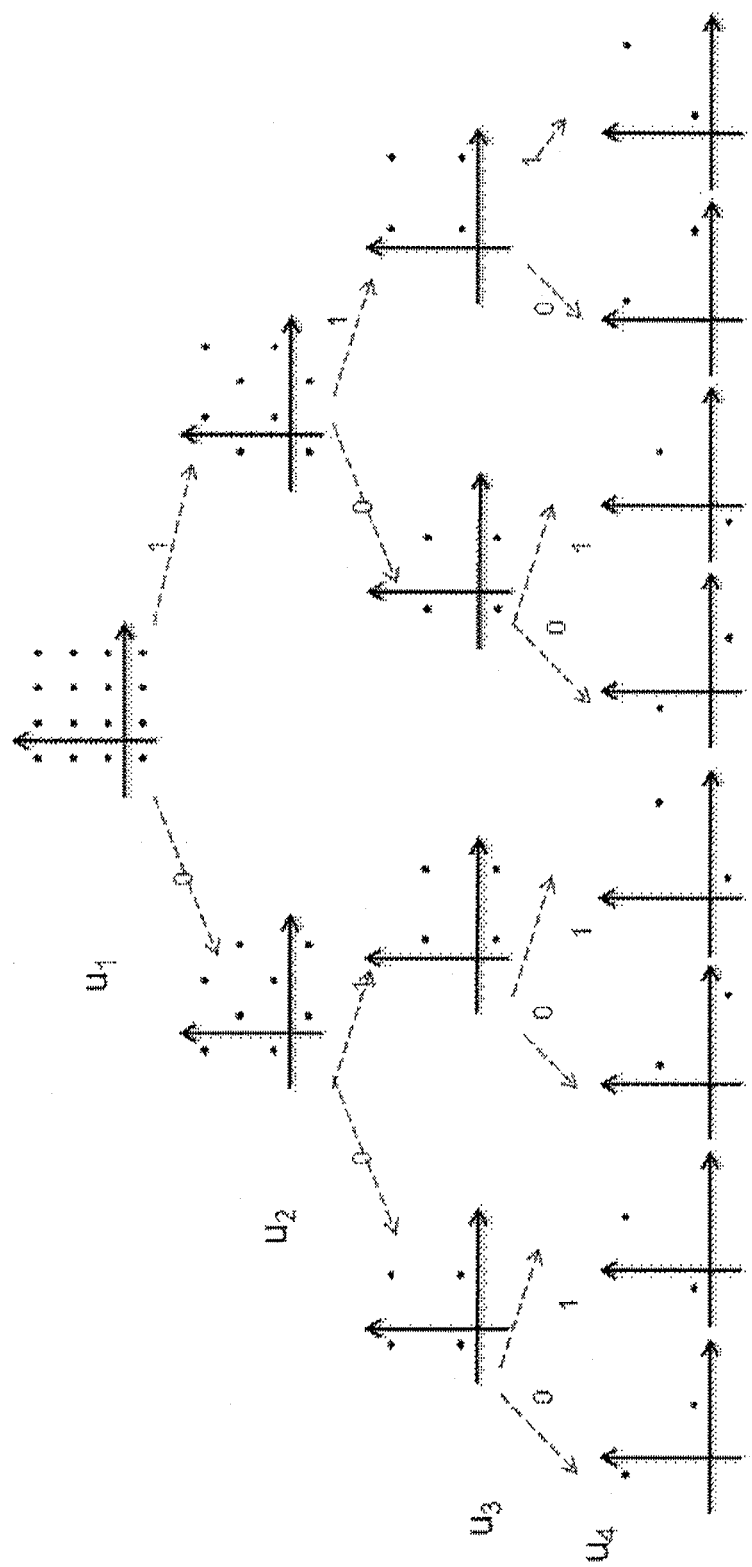
FIG. 2 is a diagram depicting a set partitioning process for a two-dimensional signal constellation according to one aspect of the subject technology.

FIG. 2 depicts an example of set partitioning of the signal constellation represented in FIG. 1. The set partitioning process divides the signal constellation into multiple sets where each step in the process seeks to increase the intra-set distance of the constellation points remaining in the set. As depicted in FIG. 2, $U_1$, $U_2$, $U_3$ and $U_4$ represent encoded bits to be modulated, where each of these encoded bits provides a binary variable at each step of the partitioning process. The division of the signal constellation points at each step may be determined using a computer algorithm configured to examine all possible combinations for the different sets and identify the combinations with the maximum intra-set distance between constellation points. The values of $U_1$, $U_2$, $U_3$ and $U_4$ used at the different steps of the partitioning process may be selected to maximize the distances between possible paths through the trellis. The selection of these values may be done based on simulations and/or trial-and-error testing.

Figure 3:
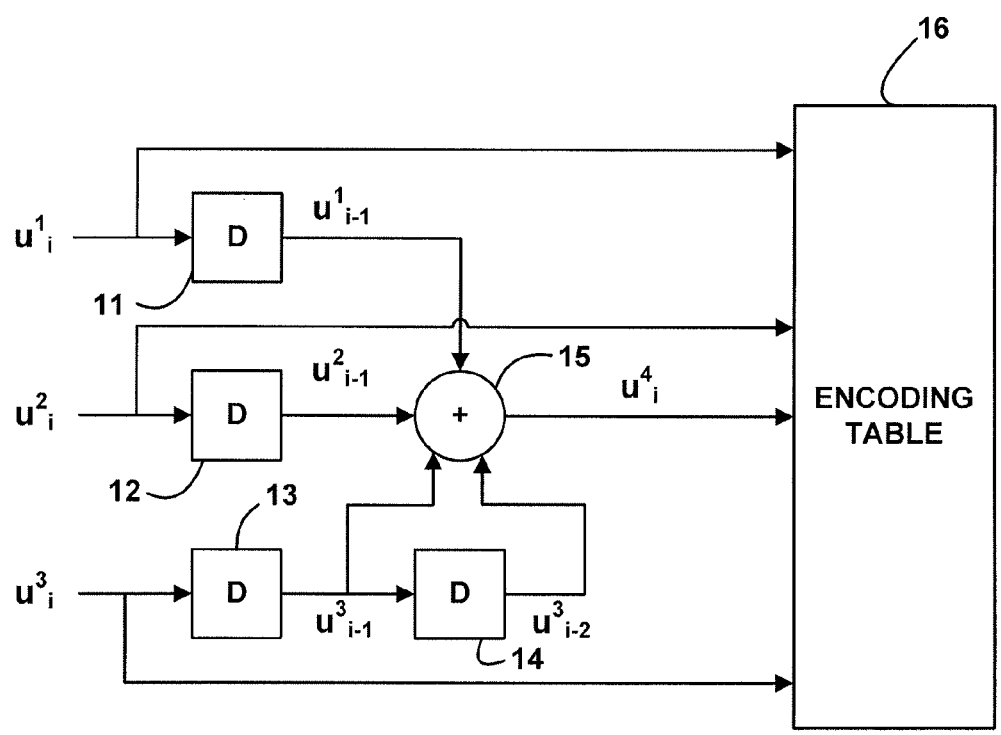
FIG. 3 is a diagram representing a convolutional encoder according to one aspect of the subject technology.

Encoding in a trellis-coded modulation scheme may be performed using either a convolutional encoder or a trellis encoder. A trellis encoder utilizes a trellis created based on the set partitioning described above. Using the states and transitions in the trellis, the output non-binary symbols corresponding to constellation points are determined based on a user sequence of input data bits. A convolutional encoder, on the other hand, relies on a convolutional code generated based on the set partitioning and resulting trellis to determine the non-binary symbols corresponding to the constellation points. FIG. 3 depicts one example of a convolutional encoder 10 created based on the set partitioning depicted in FIG. 2. As depicted in FIG. 3, a user sequence of data bits is divided into three streams represented by $U^1_i$, $U^2_i$, and $U^3_i$. In each step three bits from the user sequence are encoded with a parity bit $U^4_i$ generated using the delays 11, 12, 13, and 14 and the summer 15 as shown in the figure. Those skilled in the art will recognize that the convolutional encoder 10 depicted in FIG. 3 represents only one example of a convolutional encoder created based on the set partitioning depicted in FIG. 2. Other arrangements of convolutional encoders can be derived based on that set partitioning by those skilled in the art.

The four encoded bits, $U^1_i$, $U^2_i$, $U^3_i$, and $U^4_i$ generated by the convolutional encoder are mapped to a constellation point using an encoder mapping table 16. The encoder mapping table 16 indexes the four encoded bits against the constellation points represented by non-binary symbols corresponding to program voltage levels written into the flash memory cell sets (e.g., L0, L1, L2, L3). Table 1 below represents one example of this mapping based on the convolutional encoder 10 depicted in FIG. 3 and the set partitioning depicted in FIG. 2.

TABLE 1

| $U_1$ | $U_2$ | $U_3$ | $U_4$ | Mapping |
|---|---|---|---|---|
| 0 | 0 | 0 | 0 | (L0, L3) |
| 0 | 0 | 0 | 1 | (L2, L1) |
| 0 | 0 | 1 | 0 | (L0, L1) |
| 0 | 0 | 1 | 1 | (L2, L3) |
| 0 | 1 | 0 | 0 | (L1, L2) |
| 0 | 1 | 0 | 1 | (L3, L0) |
| 0 | 1 | 1 | 0 | (L1, L0) |
| 0 | 1 | 1 | 1 | (L3, L2) |
| 1 | 0 | 0 | 0 | (L0, L2) |
| 1 | 0 | 0 | 1 | (L2, L0) |
| 1 | 0 | 1 | 0 | (L0, L0) |
| 1 | 0 | 1 | 1 | (L2, L2) |
| 1 | 1 | 0 | 0 | (L1, L3) |
| 1 | 1 | 0 | 1 | (L3, L1) |
| 1 | 1 | 1 | 0 | (L1, L1) |
| 1 | 1 | 1 | 1 | (L3, L3) |

Figure 4:
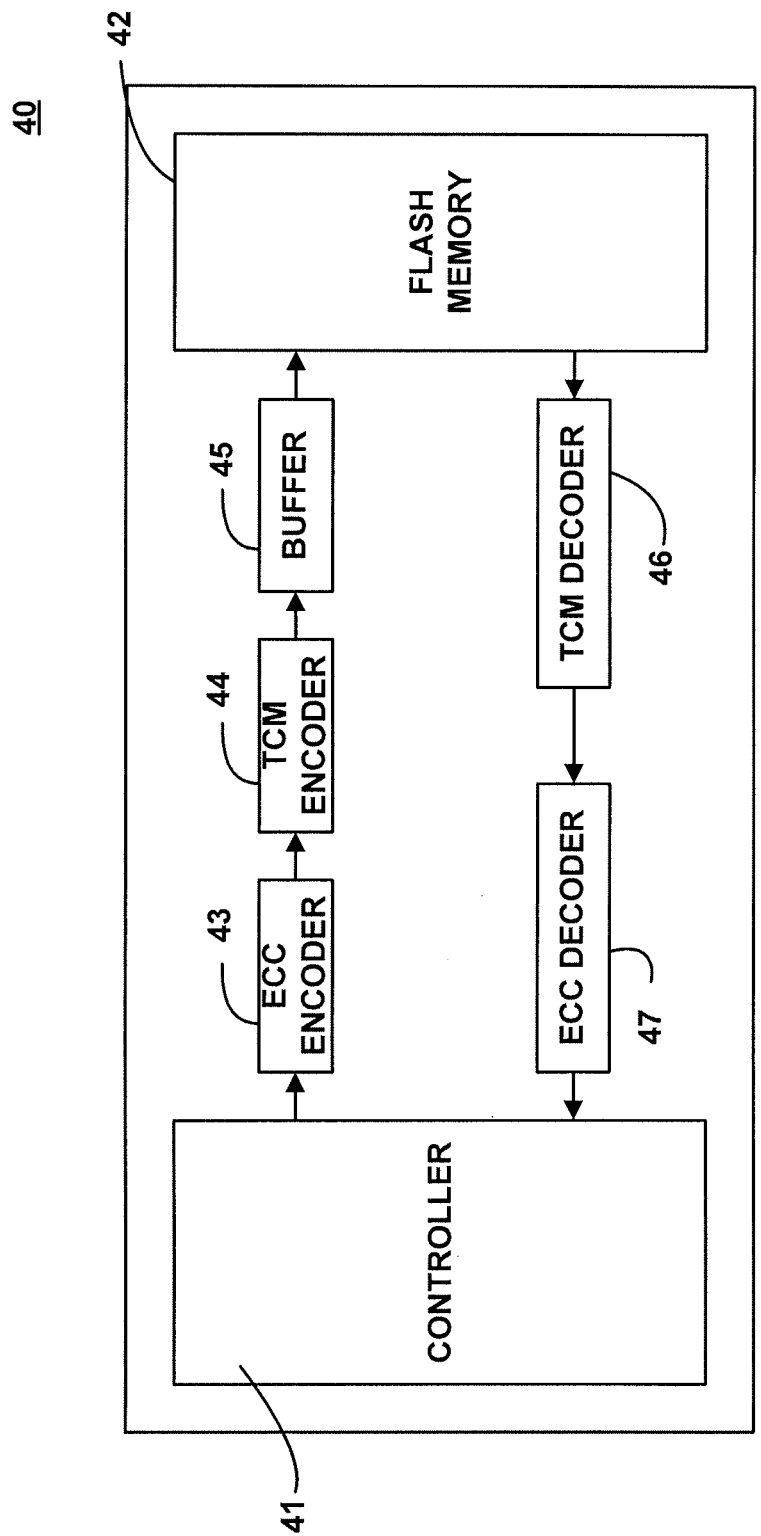
FIG. 4 is a block diagram depicting components of a MLC flash memory device according to one aspect of the subject technology.

Turning to FIG. 4, the operation of a MLC flash memory device will now be described. FIG. 4 is a block diagram depicting components of a MLC flash memory device 40 according to one aspect of the subject technology. As depicted in FIG. 4, the MLC flash memory device 40 includes a controller 41 and flash memory 42. Along a write path between controller 41 and flash memory 42, device 40 further includes ECC encoder 43, TCM encoder 44 and buffer 45. Along a read path between flash memory 42 and controller 41, device 40 further includes TCM decoder 46 and ECC decoder 47.

Controller 41 includes a processor configured to execute code or instructions to perform the operations and functionality described herein, manage request flow and address mappings, and to perform calculations and execute various commands. The processor may be a general purpose microprocessor, a microcontroller, a digital signal processor, an application specific integrated circuit, a field programmable gate array, a programmable logic device, a controller, a state machine, gated logic, discrete hardware components, or combinations of the foregoing. One or more sequences of instructions may be stored read-only memory (ROM), random access memory (RAM), flash memory 42, etc., which may be integrated into controller 41 or coupled to controller 41 to allow controller 41 to read and execute the sequences of instructions. These various types of memory represent examples of machine or computer readable media on which machine or computer executable instructions may be stored.

Controller 41 is configured to receive data from a host coupled to memory device 40. The host may be a computer, a server, a workstation, a laptop computer, a PDA, a smart phone, etc. The host also may be an electronic device such as a digital camera, a digital audio player, a digital video recorder, etc. Controller 41 may include a host interface configured to communicate data, addresses, and commands between memory device 40 and a host. The host interface be configured to implement an industry standard interface such as Serial-Attached SCSI (SAS), Fiber Channel Interface (FCI), PCI Express (PCIe), SATA, USB, etc. The host interface also may be configured to implement a proprietary interface or to be programmable to implement one of multiple different interfaces.

Flash memory 42 represents one or more arrays of MLC flash memory cells. The arrays MLC flash memory cells may be contained on a single device or chip or may be on multiple devices or chips arranged in multiple channels. Flash memory 42 is not limited to any particular capacity or configuration. For example, the number of physical blocks, physical pages per block, the number of sectors per physical page, and the size of the sectors may vary within the scope of the subject technology.

As noted above, the write path between controller 41 and flash memory 42 includes ECC encoder 43, TCM encoder 44, and buffer 45. ECC encoder 43 is an outside encoder that represents a block encoder configured to block encode data received by controller 41 and sent to flash memory 42 to be written. ECC encoder 43 may be configured to implement a Reed-Solomon (RS) encoder, a Bose, Ray-Chaudhuri, Hocquenghem (BCH) encoder, a low density parity check (LDPC) encoder, or other types of block encoders. TCM encoder 44 represents an inside TCM encoder configured to implement either a convolutional encoder and encoder mapping table or a trellis encoder as discussed above. Buffer 45 represents a memory configured to act as temporary storage for the modulated non-binary symbols generated by TCM encoder 44 prior to be sent to flash memory 42 for storage. Buffer 45 allows pages of encoded data to be accumulated before being sent to flash memory 42.

Also as noted above, the read path between flash memory 42 and controller 41 includes TCM decoder 46 and ECC decoder 47. TCM decoder 46 is configured to implement an inside trellis decoder based on the same trellis structure used to configure the convolutional encoder or trellis encoder implemented in TCM encoder 44. ECC decoder 47 is configured to implement an outside ECC encoder corresponding to the ECC encoder 43 described above.

While FIG. 4 depicts controller 41, ECC encoder 43, TCM encoder 44, buffer 45, TCM decoder 46, and ECC decoder 47 as separate components, those skilled in the art will recognize that these two or more of these components may be implemented on a common chip or device or may be implemented on separate chips or devices without departing from the scope of the subject technology.

Briefly, memory device 40 is configured to store data received from a host by the controller 41 on the flash memory 42. TCM encoder 44 and TCM decoder 46 are configured to implement a trellis-coded modulation scheme in the manner described above to encode the data received from the host prior to storage in flash memory 42 and decode data read from flash memory 42 prior to the controller 41 sending the read data to the host. Similarly, ECC encoder 43 and ECC decoder 47 are configured to encode the data received from the host using a linear block encoding scheme prior to the TCM encoder 44 encodes the data and after TCM decoder 46 decodes data read from flash memory 42. In this manner, TCM encoder 44 and TCM decoder 46 may be considered an inside or inner encoder/decoder and ECC encoder 43 and ECC decoder 47 may be considered an outside or outer encoder/decoder.

Figure 5:
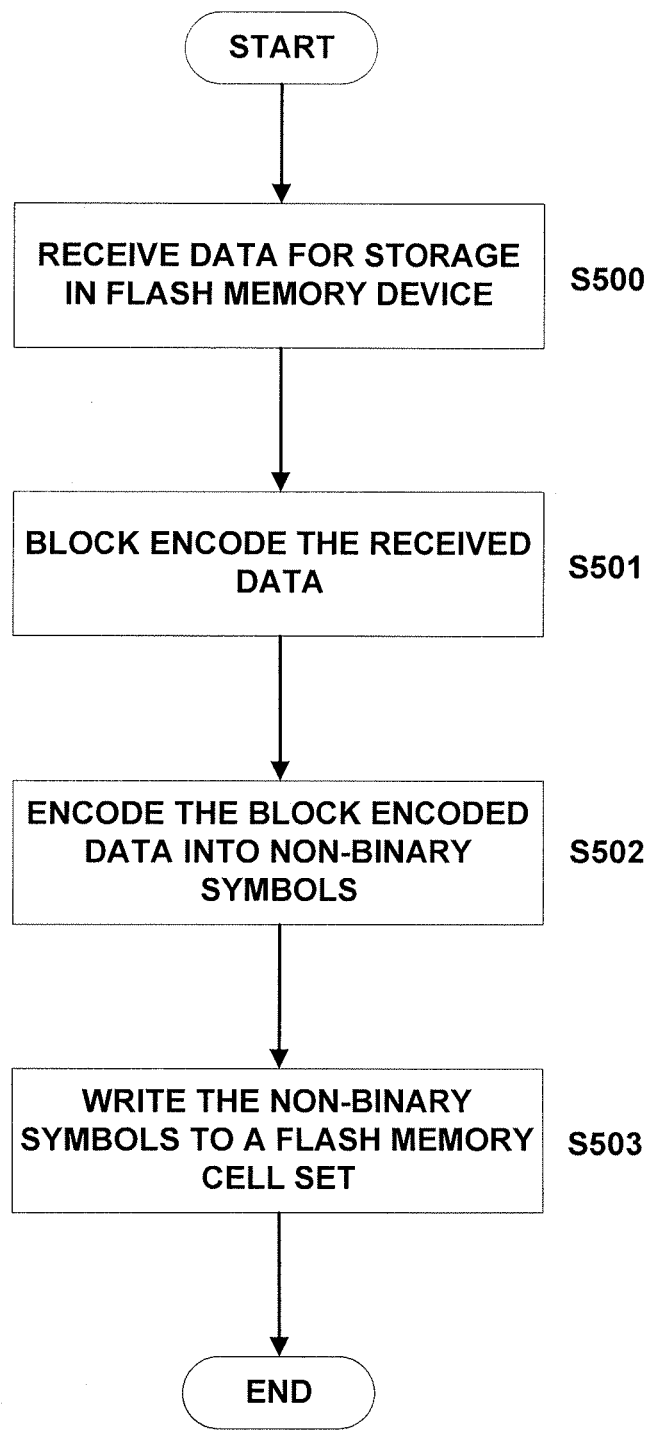
FIG. 5 is a flowchart depicting steps of a method for storing data in a MLC flash memory device according to one aspect of the subject technology.

FIG. 5 is a flowchart depicting steps in a method for storing data in a MLC flash memory device. The process 500 begins upon controller 41 receiving data from a host for storage in flash memory 42 in step S500. In step S501, ECC encoder 43 block encodes the data. In step S502, TCM encoder 44 encodes the block encoded data into non-binary symbols according to a trellis-coded modulation scheme as discussed above. In step S503, the non-binary symbols are written to respective flash memory cell set.

Figure 6:
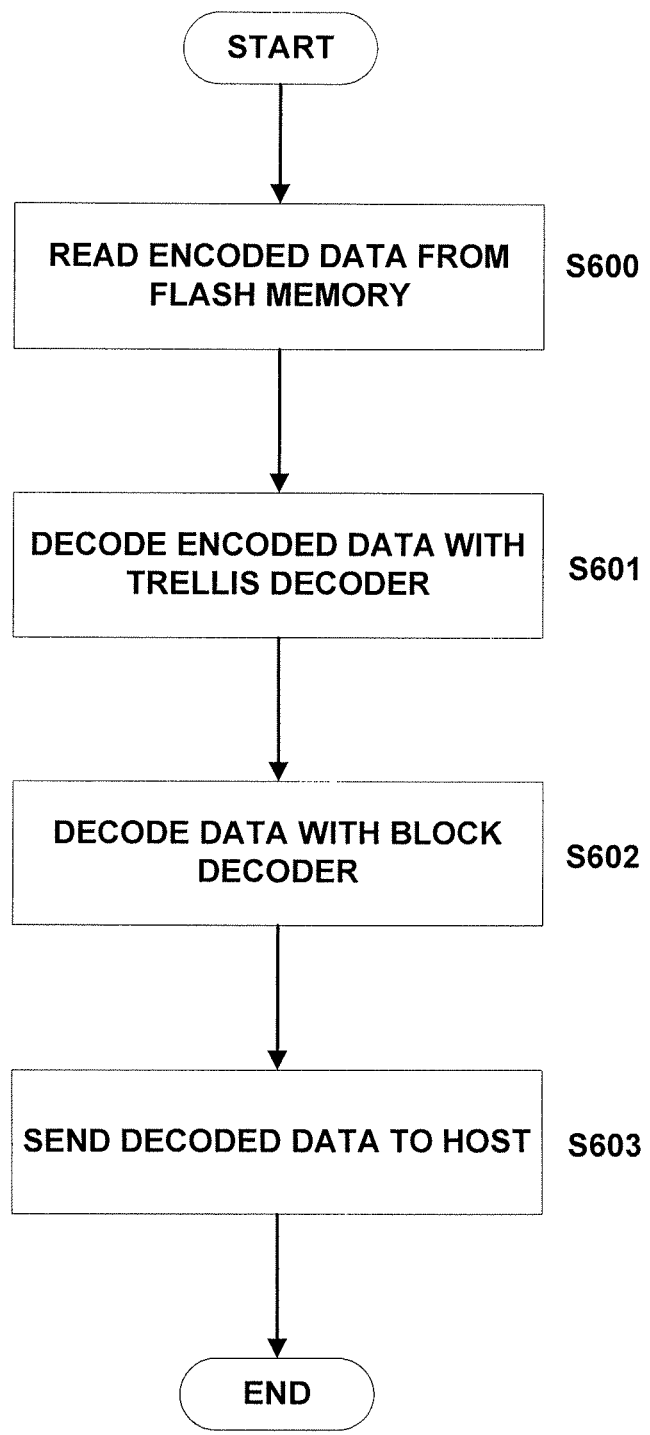
FIG. 6 is a flowchart depicting steps of a method for reading data from a MLC flash memory device according to one aspect of the subject technology.

FIG. 6 is a flowchart depicting steps in a method for reading encoded data in a MLC flash memory device. The process 600 begins upon controller 41 issuing a read command to flash memory 42. In step S600, the requested encoded data is read from flash memory 42. In step S601, the encoded data is decoded using with a trellis decoder (TCM decoder 46). The decoded data is then block decoded by ECC decoder 47 in step S602 prior to the decoded data being sent to a requesting host in step S603.

TCM decoder 46 may receive the encoded data from flash memory 42 based on hard decisions from reading the MSB and LSB of each flash memory cell. Alternatively, the performance of the trellis decoding may be improved by providing soft decision information from the flash memory 42. The soft decision information may be obtained using a detector to detect the temperature or, alternatively, using a test mode where read levels are altered between multiple read operations to learn where the program levels are with respect to standard read levels.

As noted above, the subject technology utilizes MLC flash memory cell sets, where each cell set includes two or more MLC flash memory cells. According to one aspect, the flash memory cells joined together as a set are adjacent to one another within the flash memory array in flash memory 42. In this manner, the cells are read out in the sequence in which they were encoded prior to storage. Those skilled in the art will recognize that flash memory cells joined together as a set may not be adjacent to one another within the flash memory array. When the cells of a set are not adjacent to one another, controller 41 is configured to implement control logic to reorder the encoded data read from the flash memory cells in the set prior to passing the read encoded data to TCM decoder 46.

The foregoing examples described an implementation using flash memory cell sets including two flash memory cells of two-bit MLC flash memory. Those skilled in the art will recognize that the flash memory cells may include MLC flash memory configured to store three or more bits. In addition, those skilled in the art will recognize that the flash memory cell sets may include more than two flash memory cells.

For example, an alternative implementation may use flash memory cell sets of three two-bit MLC flash memory cells. Under this example, the set partitioning and trellis derivation is performed in the manner described above. The set partitioning and trellis optimization may be performed using computer algorithms to search for set partitioning maximizing spacing between paths with the trellis or through random, trial-and-error processes. In this configuration, a 5/6 code rate may be used to improve the data storage efficiency with only one of six bits being used for parity while the 3/4 code rate above uses one of four bits for parity. Testing and simulation has confirmed that using a 5/6 code rate results in a gain of 0.2 dB and an 8% savings in redundancy compared to a 3/4 code rate.

Due to the extra complexity of a three-dimensional trellis-coded modulation scheme, a trellis encoder may be preferable to a convolutional encoder to reduce hardware and memory requirements. When encoding data using a trellis encoder, a tail biting code may be included in the data being stored to close the trellis within 2 trellis slots. The tail biting code may be configured provide a transition to state zero within the trellis so that the decoder can know the ending state and force all paths to the correct state during decoding.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as "an aspect" may refer to one or more aspects and vice versa. A phrase such as "an embodiment" does not imply that such embodiment is essential to the subject technology or that such embodiment applies to all configurations of the subject technology. A disclosure relating to an embodiment may apply to all embodiments, or to one or more embodiments. An embodiment may provide one or more examples. A phrase such as "an embodiment" may refer to one or more embodiments and vice versa. A phrase such as "a configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as "a configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for storing data in a multi-level cell (MLC) flash memory device, the method comprising:
   receiving data for storage in the flash memory device, the flash memory device comprising an array of MLC flash memory cells;
   encoding the received data into non-binary symbols according to a trellis-coded modulation scheme, the encoding including mapping a series of data bits encoded with a parity bit to a respective non-binary symbol using a mapping table;
   accumulating one or more pages of non-binary symbols in a buffer; and
   writing each of the non-binary symbols from the buffer to a respective flash memory cell set, wherein each flash memory cell set comprises a plurality of MLC flash memory cells.

2. The method according to claim 1, wherein encoding the received data comprises:
   generating an encoded data sequence from the received data; and
   mapping the encoded data sequence to one of the non-binary symbols.

3. The method according to claim 2, wherein the encoded data sequence is generated using convolutional encoding.

4. The method according to claim 2, wherein the encoded data sequence is generated using trellis encoding.

5. The method according to claim 2, wherein each MLC flash memory cell is an n-bit memory cell, where n>1, each flash memory cell set comprises m MLC flash memory cells, where m>1, and the encoded data sequence comprises n×m bits.

6. The method according to claim 2, wherein each of the non-binary symbols includes a flash program level for each of the MLC flash memory cells in the respective flash memory cell sets.

7. The method according to claim 1, further comprising block encoding the received data, wherein the block-encoded data is encoded into the non-binary symbols according to the trellis-coded modulation scheme.

8. The method according to claim 7, wherein the block encoding comprises one of Reed-Solomon (RS) coding, Bose, Ray-Chaudhuri, Hocquenghem (BCH) coding, or low density parity check (LDPC) coding.

9. A non-transitory machine-readable medium containing machine-executable instructions which when executed by a machine perform a method for storing data in a multi-level (MLC) flash memory device, the method comprising:
    receiving data for storage in the flash memory device, the flash memory device comprising an array of MLC flash memory cells;
    encoding the received data into non-binary symbols according to a trellis-coded modulation scheme;
    accumulating one or more pages of non-binary symbols in a buffer; and
    writing each of the non-binary symbols from the buffer to a respective flash memory cell set, wherein each flash memory cell set comprises a plurality of MLC flash memory cells.

10. The non-transitory machine-readable medium according to claim 9, wherein encoding the received data comprises:
    generating an encoded data sequence from the received data; and
    mapping the encoded data sequence to one of the non-binary symbols.

11. The non-transitory machine-readable medium according to claim 10, wherein the encoded data sequence is generated using convolutional encoding.

12. The non-transitory machine-readable medium according to claim 10, wherein the encoded data sequence is generated using trellis encoding.

13. The non-transitory machine-readable medium according to claim 10, wherein each MLC flash memory cell is an n-bit memory cell, where n>1, each flash memory cell set comprises m MLC flash memory cells, where m>1, and the encoded data sequence comprises n×m bits.

14. The non-transitory machine-readable medium according to claim 10, wherein each of the non-binary symbols includes a flash program level for each of the MLC flash memory cells in the respective flash memory cell sets.

15. The non-transitory machine-readable medium according to claim 9, further comprising block encoding the received data, wherein the block-encoded data is encoded into the non-binary symbols according to the trellis-coded modulation scheme.

16. The non-transitory machine-readable medium according to claim 15, wherein the block encoding comprises one of Reed-Solomon (RS) coding, Bose, Ray-Chaudhuri, Hocquenghem (BCH) coding, or low density parity check (LDPC) coding.

17. A multi-level cell (MLC) flash memory device, comprising:
    a controller configured to receive data for storage in the flash memory device, the flash memory device comprising an array of MLC flash memory cells;
    an encoder configured to encode the received data into non-binary symbols according to a trellis-coded modulation scheme; and
    an array of MLC flash memory cells configured to store each of the non-binary symbols to a respective flash memory cell set in response to a write command received from the controller, wherein each flash memory cell set comprises a plurality of MLC flash memory cells; and
    a buffer for accumulating the non-binary symbols before the non-binary symbols are sent to the array of MLC flash memory cells.

18. The MLC flash memory device according to claim 17, wherein the encoder comprises:
    an inside encoder configured to generate an encoded data sequence from the received data; and
    a mapper configured to map the encoded data sequence to one of the non-binary symbols.

19. The MLC flash memory device according to claim 18, wherein the inside encoder is a convolutional encoder.

20. The MLC flash memory device according to claim 18, wherein the inside encoder is a trellis encoder.

21. The MLC flash memory device according to claim 18, wherein each MLC flash memory cell is an n-bit memory cell, where n>1, each flash memory cell set comprises m MLC flash memory cells, where m>1, and the encoded data sequence comprises n×m bits.

22. The MLC flash memory device according to claim 18, wherein each of the non-binary symbols includes a flash program level for each of the MLC flash memory cells in the respective flash memory cell sets.

23. The MLC flash memory device according to claim 17, further comprising a block encoder configured to block encode the received data, wherein the encoder is configured to encode the block-encoded data into the non-binary symbols according to the trellis-coded modulation scheme.

24. The MLC flash memory device according to claim 23, wherein the block encoder comprises a Reed-Solomon (RS) encoder, a Bose, Ray-Chaudhuri, Hocquenghem (BCH) encoder, or a low density parity check (LDPC) encoder.

* * * * *